United States Patent
Lu et al.

(10) Patent No.: US 7,496,155 B1
(45) Date of Patent: Feb. 24, 2009

(54) DUTY CYCLE CORRECTION OF A MULTI-GIGAHERTZ CLOCK SIGNAL WITH CROSSOVER POINT CONTROL

(75) Inventors: Jinghui Lu, Austin, TX (US); Yiqin Chen, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 640 days.

(21) Appl. No.: 11/228,655

(22) Filed: Sep. 16, 2005

(51) Int. Cl.
*H04L 27/00* (2006.01)

(52) U.S. Cl. .................. 375/326; 327/172; 327/175; 327/122; 700/28; 331/48; 330/10

(58) Field of Classification Search .............. 375/326; 327/172, 175, 122; 700/28; 331/48; 330/10
See application file for complete search history.

(56) References Cited

U.S. PATENT DOCUMENTS

| | | | | |
|---|---|---|---|---|
| 4,959,557 A | * | 9/1990 | Miller | 327/175 |
| 5,280,424 A | * | 1/1994 | Rony et al. | 700/28 |
| 6,016,081 A | * | 1/2000 | O'Shaughnessy | 331/48 |
| 6,084,452 A | * | 7/2000 | Drost et al. | 327/175 |
| 6,356,129 B1 | * | 3/2002 | O'Brien et al. | 327/175 |
| 6,492,868 B2 | * | 12/2002 | Kirn | 330/10 |
| 6,593,789 B2 | * | 7/2003 | Atallah et al. | 327/175 |
| 6,611,218 B1 | * | 8/2003 | Lu et al. | 341/101 |
| 6,864,728 B1 | * | 3/2005 | Lu | 327/122 |

* cited by examiner

Primary Examiner—Sudhanshu C Pathak
(74) Attorney, Agent, or Firm—James Harrison (57) ABSTRACT

A clock recovery circuit includes a crossover adjustment circuit operable to adjust a crossover point to adjust a corresponding duty cycle. The adjustment circuit comprises a feedback adjustment combining element which is implemented as summing elements and a crossover point control clock amplifier, an operational amplifier with a resistor in place of a low pass filter at an input of the operational amplifier and feedback driver. The summing element within the feedback adjustment combining element combines input clocks with feedback signals, the crossover point control clock amplifier includes adjustment driver, the two cross coupled PMOS along with the resistor connected between them, reshape input clocks, adjust cross over point and provide output clocks with DCD corrected. A modified Miller capacitor comprising a resistor in series with a capacitor across a drain and gate of a cascode transistor pair is utilized in an output stage to adjust corner frequencies.

16 Claims, 11 Drawing Sheets

FIG. 1

FIG. 2
clock recovery circuit 10

FIG. 3
phase detector 14

FIG. 4
MGT 70

FIG. 12
Miller capacitor (prior art)

FIG. 13
pole adjust circuit based on Miller capacitor for cascode transistors

FIG. 7
receiver 150 with a half data rate CDR architecture

FIG. 8
clock adjust block 156

FIG. 9
clock adjust circuit 226

FIG. 10

FIG. 11
operational amplifier 250

FIG. 14
MGT in columnar FPGA architecture

DUTY CYCLE CORRECTION OF A MULTI-GIGAHERTZ CLOCK SIGNAL WITH CROSSOVER POINT CONTROL

BACKGROUND OF THE INVENTION

1. Technical Field of the Invention

This invention relates generally to communication systems and more particularly to clock circuitry for high data rate communication systems.

2. Description of Related Art

Communication systems are known to transport large amounts of data between a plurality of end user devices which, for example, include telephones, facsimile machines, computers, television sets, cellular telephones, personal digital assistants, etc. As is also known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or Internet. As is further known, communication systems include a plurality of system equipment to facilitate the transporting of data. Such system equipment includes, but is not limited to, routers, switches, bridges, gateways, protocol converters, frame relays, private branch exchanges, etc.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit per second and beyond. Synchronous Optical NETwork (SONET), for example, requires 10 gigabits per second. In accordance with such standards, many system components and end user devices of a communication system transport data via serial transmission paths. Internally, however, the system components and end user devices process data in a parallel manner. As such, each system component and end user device must receive the serial data and convert the serial data into parallel data without loss of information. Accurate recovery of information from high-speed serial transmissions typically requires transceiver components that operate at clock speeds equal to or higher than the received serial data rate. Higher clock speeds limit the usefulness of prior art clock recovery circuits that require precise alignment of signals to recover clock and/or data. Higher data rates require greater bandwidth for the feedback loop to operate correctly. Some prior art designs are bandwidth limited.

As the demand for data throughput increases, so do the demands on a high-speed serial transceiver. Modulation rates may be increased to increase the data throughput for a given clock speed at the expense of greater complexity. The increased throughput demands are pushing some current integrated circuit manufacturing processes to their operating limits, where integrated circuit processing limits (e.g., device parasitics, trace sizes, propagation delays, device sizes, etc.) and integrated circuit (IC) fabrication limits (e.g., IC layout, frequency response of the packaging, frequency response of bonding wires, etc.) limit the speed at which the high-speed serial transceiver may operate without excessive jitter performance and/or noise performance.

A further alternative for high-speed serial transceivers is to use an IC technology that inherently provides for greater speeds. For instance, switching from a CMOS process to a silicon germanium or gallium arsenide process would allow integrated circuit transceivers to operate at greater speeds, but at substantially increased manufacturing costs. CMOS is more cost effective and provides easier system integration. Currently, for most commercial-grade applications, including communication systems, such alternate integrated circuit fabrication processes are too cost prohibitive for wide spread use.

What is needed, therefore, is an apparatus that can receive high-speed serial transmissions in a variety of modulation modes, extract the information, and provide the extracted serial data to parallel devices at data rates that ensure data integrity and can be obtained with cost-conscious technology. Moreover, as circuit complexities continue to increase and IC real estate continues to shrink, a premium demand exists for new designs that are operable to achieve desired performance requirements while simplifying circuit designs and reducing required IC real estate by eliminating circuit components. Thus, a further need exists for simplified circuits that achieve specified circuit performance requirements.

BRIEF SUMMARY OF THE INVENTION

The described embodiments of the present invention substantially solve the previously described problems by providing a method and circuit for duty cycle correction of duty cycle distortion (DCD) of a multi-gigaHertz clock signal with crossover point control. A clock recovery circuit in accordance with an exemplary embodiment of the present invention includes a phase detector and a charge pump operably coupled to detect a modulated signal to produce a recovered clock in a high data serial receiver. Additionally, in one embodiment of the invention, a crossover adjustment circuit is operable to adjust a crossover point which adjusts a corresponding duty cycle of the recovered clock to desirably achieve as much as possible a fifty percent duty cycle.

The crossover adjust circuit, is comprised of a feedback adjustment combining element which is further comprised of summing element and crossover point control clock amplifier. The crossover point control clock amplifier adjusts input clock signals and provides duty cycle distortion (DCD) corrected output clock signals. Additionally, the adjust circuit comprises an operational amplifier with a resistor in place of a low pass filter at an input of the operational amplifier thereby eliminating at least one capacitor. Parasitic capacitance of an input of the operational amplifier, in conjunction with the resistor, provide adequate filtering in an embodiment in which an operational amplifier bandwidth is selected to be substantially lower than a clock and a data rate of the input serial data stream.

Accordingly, substantial IC real estate savings may be achieved by removing at least one large filter capacitor from an input of the operational amplifier in similar configurations. A modified Miller capacitor is utilized in an output stage of a two-stage operational amplifier of the adjustment circuit to lower the corner frequency of a low frequency pole and to increase the corner frequency of a high frequency pole.

Finally, a feedback driver is operable to provide a duty cycle feedback signal to the summing element which couples to an input of the first crossover point control clock amplifier. The duty cycle distortion correction circuit of the various embodiments of the present invention may be implemented in a full rate transmit architecture or in a half rate transmit architecture, where odd and even data are combined into serial data stream at the output of a parallel-to-serial conversion.

A clock without correction for duty cycle distortion can lead to transmit output eye asymmetry. Accordingly, a circuit for accurately controlling a clock's duty cycle to 50-to-50 is desired. Implementation of at least some of the described embodiments of the invention in either a full or half rate transmit architecture thus is operable to achieve or substantially achieve the 50-to-50 duty cycle.

DETAILED DESCRIPTION OF THE INVENTION

Figure 1:
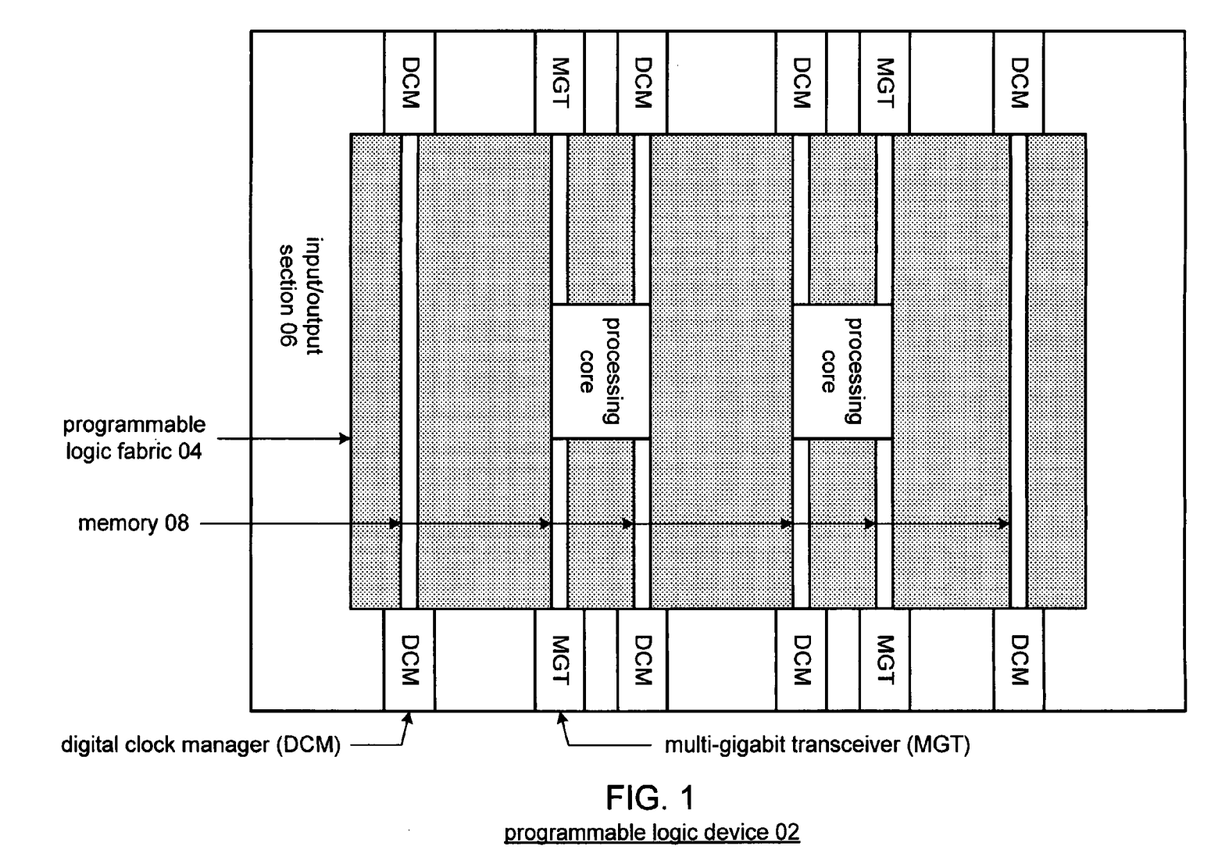
FIG. 1 is a schematic block diagram of a programmable logic device that includes programmable logic fabric, an input/output section, and memory.

FIG. 1 is a schematic block diagram of a programmable logic device 02 that includes programmable logic fabric 04, an input/output section 06, and memory 08. The programmable logic fabric 04 may include one or more processing cores and programmable logic circuitry. Such programmable logic circuitry may include programmable logic arrays (PLAs), programmable array logic (PAL) devices, erasable programmable logic devices (EPLDs) and/or programmable gate arrays (PGAs). Memory 08 may be block random access memory (BRAM). Input/output section 06 may include a plurality of digital clock managers (DCMs) and a plurality of multi-gigabit transceivers (MGTs).

The DCMs provide various clock signals to the programmable logic fabric 04 and may further provide clock signals to the multi-gigabit transceivers. The multi-gigabit transceivers provide digital interfaces for the programmable logic fabric 04 to exchange data with components external to the programmable logic device 02. In general, the multi-gigabit transceivers provide serial-to-parallel conversion of received serial data and provide parallel-to-serial conversion for outgoing data. Further, the digital clock managers may provide clock signals to memory, or other input/output modules, for double data rate and quad data rate accesses.

Figure 2:
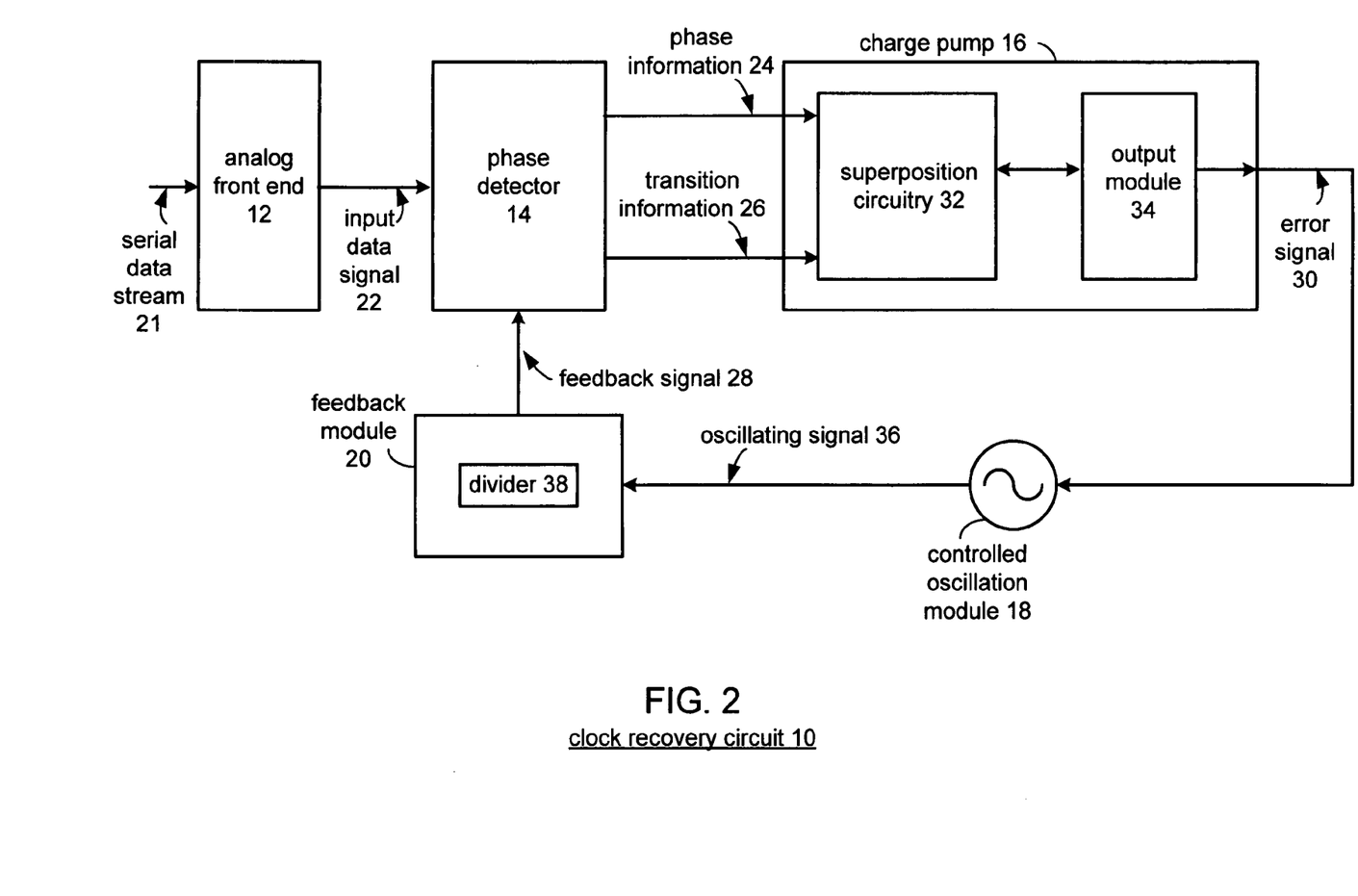
FIG. 2 illustrates a block diagram of a clock and/or data recovery circuit in accordance with the preferred embodiment of the present invention.

FIG. 2 illustrates a block diagram of a clock and/or data recovery circuit 10 in accordance with the preferred embodiment of the present invention. The clock recovery circuit 10 includes an analog front end 12, a phase detector 14, a charge pump 16, a controlled oscillation module 18, and a feedback module 20. Charge pump 16 includes superposition circuitry 32 and an output module 34.

Analog front end 12 receives a serial data stream, which may be a high data rate bit stream transferring data at 10 or more gigabits per second. This high data rate usually results in some loss of high frequency components of the bit stream due to the limited bandwidth of the input line. Analog front end 12 provides amplitude equalization to produce input data signal 22. Phase detector 14 produces phase information 24 and transition information 26 based on the input data signal 22 and a feedback signal 28. Operation of phase detector 14 will be discussed in greater detail with reference to FIG. 3. Charge pump 16 produces an error signal 30 based on the phase information 24 and transition information 26. Operation of charge pump 16 will be discussed in greater detail with reference to FIG. 3. The controlled oscillation module 18 receives the error signal 30 and produces therefrom an oscillating signal 36. Feedback module 20 and a divider 38 generate feedback signal 28 by dividing oscillating signal 36 by a divider value, which may be a whole or fractional number equal to or greater than one. Feedback module 20 produces feedback signal 28 which represents the recovered clock signal. Feedback module 20 and divider 38 adjust feedback signal 28 to one-half the data rate of the input data signal.

Figure 3:
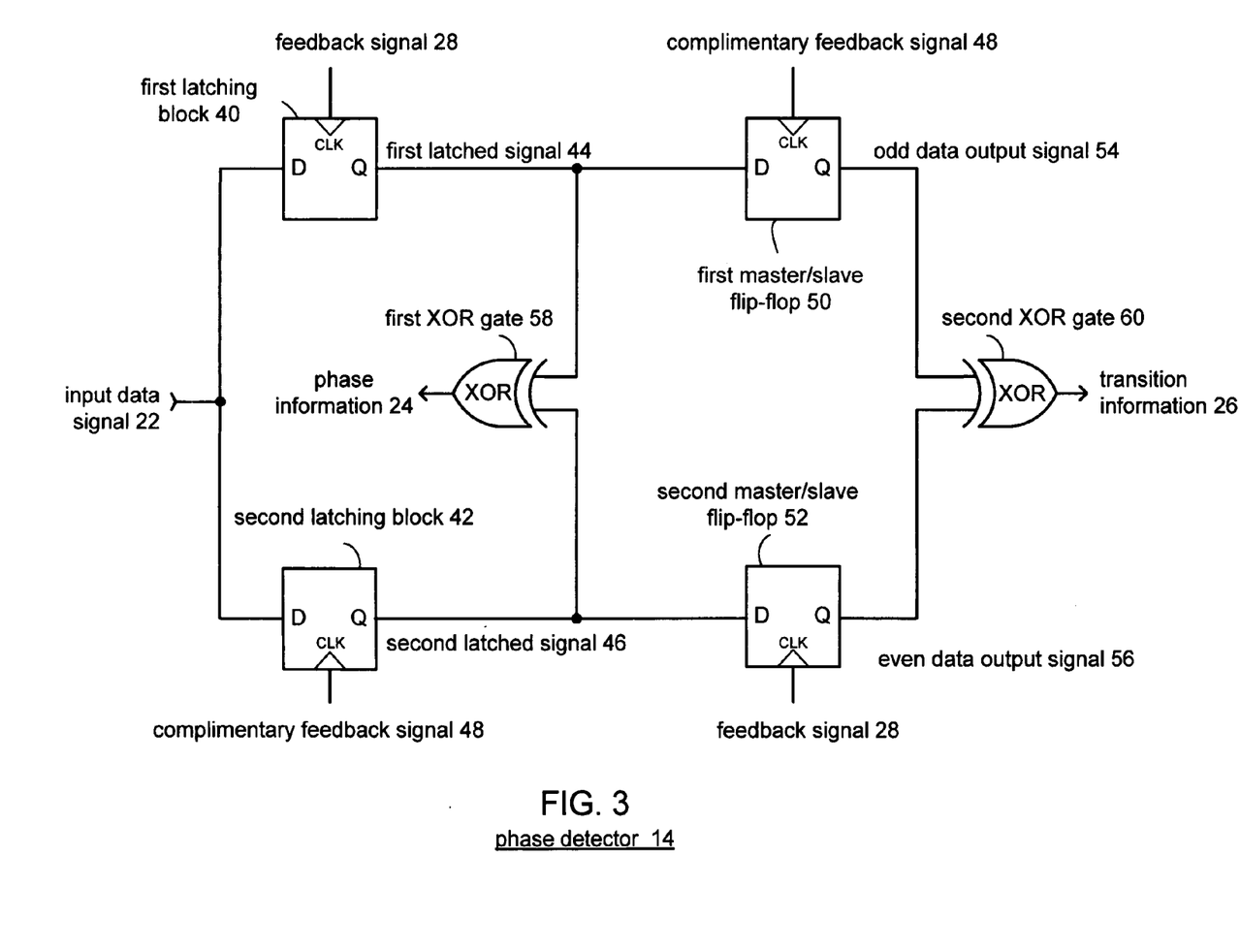
FIG. 3 illustrates a schematic block diagram of a phase detector of the clock recovery circuit of FIG. 2 according to one embodiment of the invention.

FIG. 3 illustrates a schematic block diagram of phase detector 14 of the clock recovery circuit of FIG. 2 according to one embodiment of the invention. The operation of phase detector 14 of FIG. 3 illustrates half rate operation according to one embodiment of the invention. Phase detector 14 functions to produce phase information 24 and transition information 26 based on the relationship between input data signal 22 and feedback signal 28. Generally, phase information 24 reflects a phase relationship of an input signal with respect to the feedback signal, while transition information 26 reflects that there has been a logic state change between two successive data bits of the input data. More specifically, phase information 24 is representative of the relative phase difference between input data signal 22 and feedback signal 28. As described previously, the feedback signal is adjusted to one-half the data rate of the input data signal or to another desired fractional rate of the data based on the data recovery scheme.

With the high data rates prevalent in data communications, designing a 10 or greater gigabit per second oscillator is difficult. By using a one-half data rate design and sampling on both the rising and falling edges of the feedback signal as disclosed herein, an effective 10 gigabit per second rate is achieved with a 5 gigabit clock rate.

The data contained in input data signal 22 is essentially random. A receiver is likely to receive a consecutive series of logic ones or logic zeros on occasion, as it is likely to receive an alternating pattern of logic ones and logic zeros on occasion. Phase detector 14 produces transition information 26 to indicate a change in logic levels of input data signal 22. Transition information 26 will remain at logic one as long as the input data signal 22 changes states at least once every one-half clock cycle, or 100 pico-seconds for the 5 GHz feedback signal of the present design in a locked condition where data and clock are 90 degrees out of phase, i.e., sampling in the middle of the data. The transition information changes to a logic zero when the input data signal logic level remains constant, indicating the same level of consecutive data bits. When there is not a transition on the data, charge pump 16 uses the transition information to prevent controlled oscillation module 18 from erroneously changing frequency on an average.

Continuing with the description of FIG. 3, input data signal 22 is coupled to a first latching block 40 and a second latching block 42 to produce a first latched signal 44 and a second latched signal 46, respectively. As is known by one of average skill in the art, latches couple data on an input terminal D to an output terminal Q as long as a CLK terminal on the latch is at logic one and samples the data on the falling edge of the clock (or vice versa). First latching block 40 receives feedback signal 28 at the CLK terminal, while second latching block 42 receives a complimentary feedback signal 48 at the CLK terminal. Thus, one latch triggers on a rising edge of the feedback signal while the other effectively triggers on a falling edge of the feedback signal.

The first latched signal 44 and second latched signal 46 are further coupled to a first exclusive OR (XOR) gate 58 to produce phase information 24. Due to the quadrature sampling of feedback signals (feedback signal 28 and complimentary feedback signal 48) and the first XOR gate 58, phase information 24 will be proportional to the phase difference between input data signal 22 and feedback signal 28. The output thus reflects how far the transition edge of feedback signal 28 (or complimentary feedback signal 48) is from the center of a data bit. The pulse width of phase information 24, when there is a transition in the input data, will be one-half bit period when the feedback signal is centered on the data bit.

First latched signal 44 and second latched signal 46 are coupled to a first master/slave flip-flop 50 and a second master/slave flip-flop 52, respectively. Operation of a master/slave flip-flop differs from operation of a latch in that data on the input terminal D will be sampled during the transition of the CLK signal then the sampled data is coupled to the output terminal Q during the next alternate transition of the CLK signal. Operation of the latch followed by the master/slave flip-flop clocked by complimentary clock signals (feedback signal 28 and complimentary feedback signal 48) serves to produce an output signal composed of alternate bits in the input data signal (half of the full rate). First master/slave flip-flop 50 will produce an odd data output signal 54, while second mater/slave flip-flop 52 will produce an even data output signal 56. One of average skill in the art will recognize that the choice of even and odd is simply a method to describe the contents of the data signal from an arbitrary point in time and should not be construed to mean the actual logic state of the data.

The odd data output signal 54 and even data output signal 56 are coupled to a second XOR gate 60 to produce transition information 26. The transition information is indicative of a change in input data signal 22 logic levels.

Figure 4:
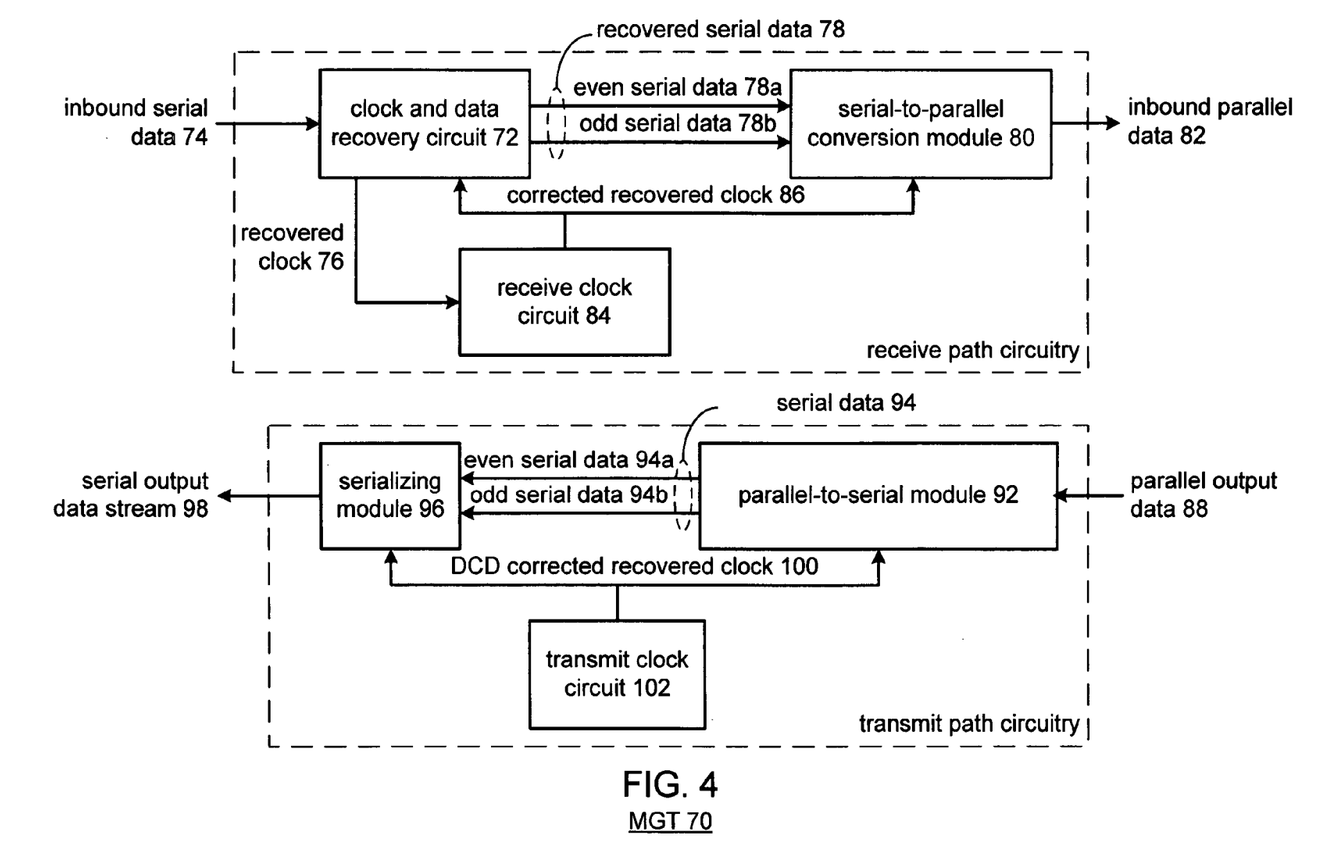
FIG. 4 is a schematic block diagram of a multi-gigabit transceiver (MGT) according to one embodiment of the present invention.

FIG. 4 is a schematic block diagram of a multi-gigabit transceiver (MGT) 70 according to one embodiment of the present invention. The MGT 70 includes receive path circuitry that includes a clock and data recovery circuit 72 that is coupled to receive inbound serial data 74 and that produces a recovered clock 76 and recovered serial data 78 (which is comprised of even serial data 78*a* and odd serial data 78*b*), a serial-to-parallel conversion module 80 that produces inbound parallel data 82 based upon the recovered serial data 78. Clock and data recovery circuit 72 produces recovered clock 76 to receive clock circuit 84. Receive clock circuit 84 produces a corrected recovered clock 86 to the clock and data recovery circuit 72 and the serial-to-parallel conversion module 80 based upon recovered clock 76.

The MGT of FIG. 4 further includes parallel-to-serial conversion transmit path circuitry that is coupled to receive parallel output data 88 and that produces serial output data stream 98 based upon the parallel output data 88. Generally, a parallel-to-serial module 92 is operable to receive parallel output data 88 and to produce serial data 94 comprising even serial data 94*a* and odd serial data 94*b*. A serializing module 96 is operable to produce serial output data stream 98 based upon serial data 94 and a DCD corrected clock signal 100 produced by transmit clock circuit 102.

In operation, MGT 70 receives parallel output data 88 from the programmable logic fabric (for example, programmable logic fabric 04 of FIG. 1), memory (memory 08 of FIG. 1), or other sources, and converts parallel output data 88 into serial output data stream 98. To facilitate the parallel-to-serial conversion, a parallel-to-serial path, which may include an elastic store buffer, receives parallel-to-serial settings from the processing core to indicate the width of parallel output data 88 and the data rate of the parallel data in one embodiment. Based on the parallel-to-serial settings and at least one transmit clock, parallel-to-serial module 92 produces serial output data stream 98 from parallel output data 88.

MGT 70 also receives inbound serial data 74 from a source external to programmable logic device 02 and converts it into inbound parallel data 82. Clock and data recovery circuit 72 receives inbound serial data 74 and latches the serial data at a rate substantially equal to one-half the serial data rate to produce recovered serial data 78 and recovered clock 76. Serial-to-parallel conversion module 80, which may include an elastic store buffer, receives recovered serial data 78 at a serial rate in accordance with recovered clock 76. Based on serial-to-parallel settings received from the processing core, serial-to-parallel conversion module 80 produces inbound parallel data 82 to downstream components. The serial-to-parallel settings indicate the data rate and data width of the inbound parallel data 82.

Figure 5:
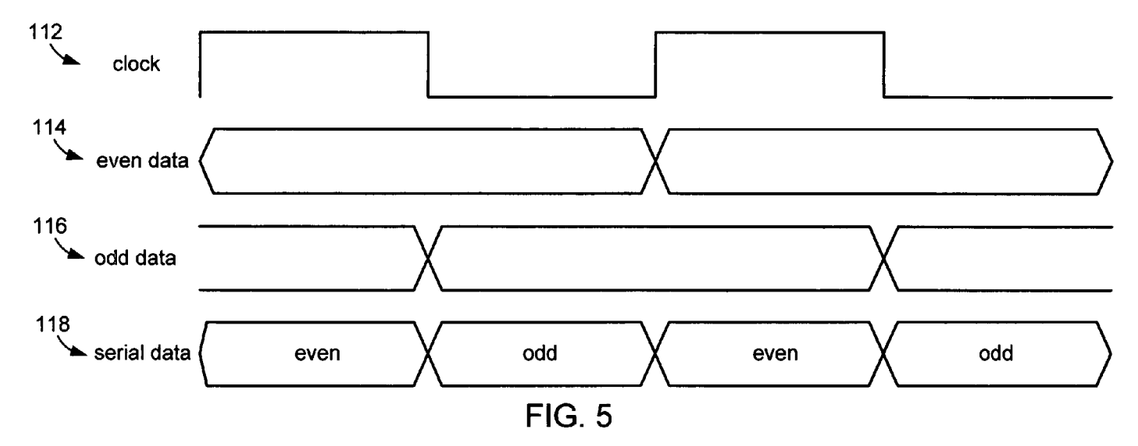
FIG. 5 is a signal diagram that illustrates ideal operation of a clock circuit.

FIG. 5 is a signal diagram that illustrates ideal operation of a clock circuit in relation to a serial data stream based upon the recovered clock. Referring now to FIG. 5, a first row 112 shows a clock signal and may represent, for example, a recovered clock, such as recovered clock 76 of FIG. 4. A second row 114 illustrates an even data signal which may be, for example, even serial data 78*a*. Similarly, a third row 116 illustrates odd data, such as odd serial data 78*b*. Finally, a fourth row 118 illustrates serial data that is generated from the combination of the even data and odd data as determined from the rising and falling edges of the clock shown in first row 112. Generally, utilizing a circuit as shown in FIG. 3 is operable to produce the results shown here in FIG. 5 as long as a duty cycle of the clock signal is approximately equal to fifty percent.

Figure 6:
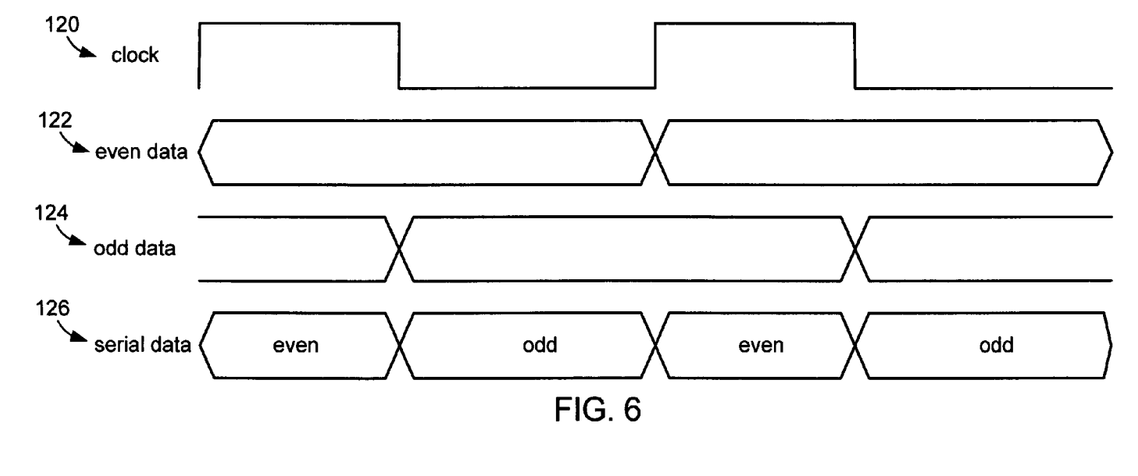
FIG. 6 is a signal diagram that illustrates non-ideal operation of a clock circuit that does not have a fifty percent duty cycle.

FIG. 6 is a signal diagram that illustrates non-ideal operation of a circuit in relation to a serial data stream based upon the recovered clock that does not have a fifty percent duty cycle. Such non-ideality may be caused by circuit elements such as buffers and other elements in the clock path that introduce delay. The non-ideal duty cycle results in a serial data pattern in which either the even data or odd data portion of the output serial data contains a period that is substantially longer than the other. Here in FIG. 6, a recovered clock 120 that does not have an ideal fifty percent duty cycle is used to latch even and odd data of rows 122 and 124, respectively, on rising and falling edges of the clock 120. Due to the asymmetric nature of the clock shown in row 120, in the described example, the period of the odd data is much longer than that of the even data as shown in serial data output 126.

In situations in which the duty cycle deviate substantially from fifty percent, such asymmetric data output patterns as shown in row 126 may result in data bits that are inaccurately interpreted. For example, a sample that drifts off of a center of an expected clock pulse taken on data based on a recovered clock that does not have a fifty percent duty cycle may not trigger a data read during a short data pulse, especially in a high data rate system and may result in an inaccurate sampling. Thus, the undesirable effects illustrated in FIG. 6 are desirably eliminated by correcting the clock duty cycle to provide a desired fifty percent duty cycle.

Figure 7:
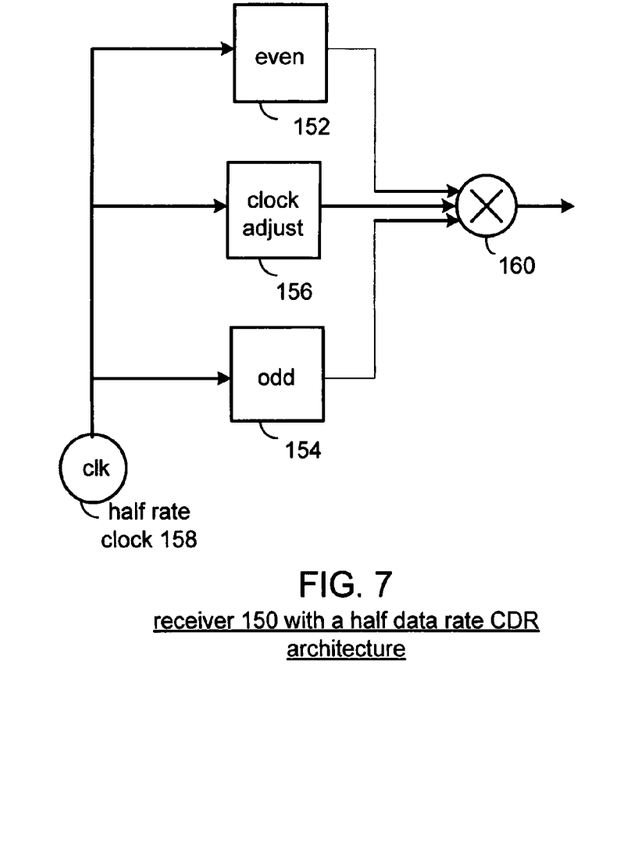
FIG. 7 is a functional block diagram of a half data rate clock data recovery (CDR) architecture with clock adjust according to one embodiment of the invention that is operable to adjust an asymmetric clock to provide a fifty percent duty cycle.

FIG. 7 is a functional block diagram of a half data rate clock data recovery (CDR) architecture with a clock adjust block according to one embodiment of the invention that is operable to adjust an asymmetric clock to provide a fifty percent duty cycle. As may be seen, a receiver 150 includes an even data processing block 152, an odd data processing block 154, and a clock adjust block 156.

Each of the blocks 152, 154 and 156 are operably coupled to receive a half rate clock pulse from half rate clock 158. A combining element 160 is generally operable to combine the even data and odd data produced by even data processing block 152 and odd data processing block 154 based upon an adjusted clock produced by clock adjust block 156. The duty cycle of the clock signal received from half rate clock 158 is adjusted by clock adjust block 156 to facilitate combining element 160 producing even and odd data having a substantially similar period as in the case of an ideal fifty percent duty cycle clock.

Figure 8:
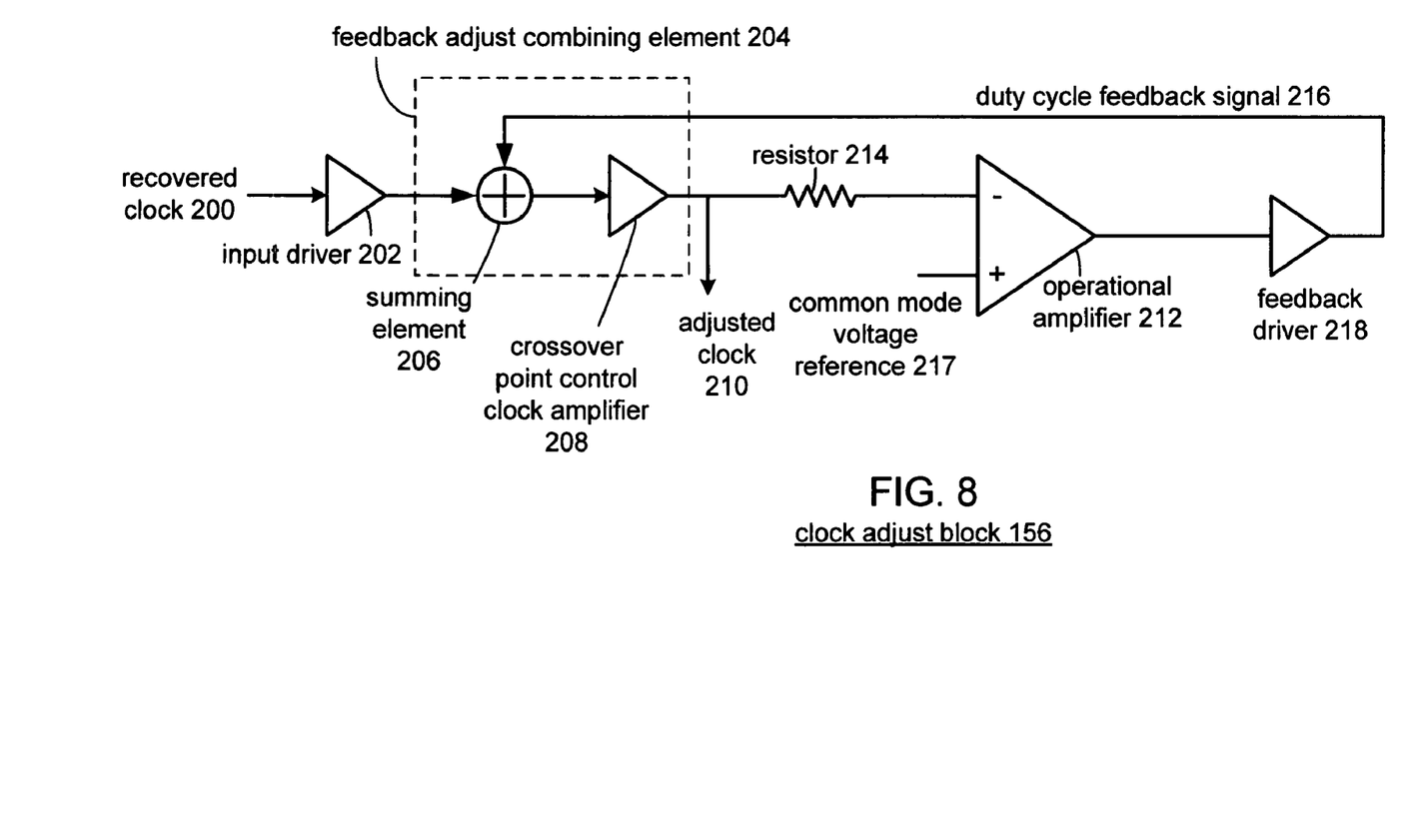
FIG. 8 is a functional block diagram of a clock adjust block according to one embodiment of the invention.

FIG. 8 is a functional block diagram of a clock adjust block according to one embodiment of the invention. The clock adjust block of FIG. 8 is a single ended block and is presented for exemplary purposes of one embodiment of the invention. Recovered clock 200 may comprise, for example, recovered clock 76 of FIG. 4. Recovered clock 200 is conducted through a driver 202 and is input to a feedback adjust combining element 204 that is operably disposed to receive a duty cycle feedback signal through a feedback loop. Generally, the feedback loop is operable to adjust a signal level crossover point of the clock and, therefore, to adjust the clock duty cycle. Thus, adjusted clock 210 may be produced from the output of the feedback adjustment combining element 204.

Feedback adjust combining element 204 may comprise a summing element 206 or a circuit that comprises a crossover point control clock amplifier 208 in addition to summing element 206. Alternatively, feedback adjust combining element 204 may merely consist of a common node to which a feedback loop as described below is coupled and a circuit to adjust crossover point based on a received feedback signal in a feedback loop.

Thus, recovered clock 200 is produced to the feedback adjustment combining element 204 for combining (adjustment) with a duty cycle feedback signal at an input of the summing element within the feedback adjustment combining element 204 to adjust the crossover points of clock signals. The output (i.e. the adjusted clock signals) of the feedback adjustment combining element is then conducted through a low pass filter. Often, the low pass filter is operably coupled to an input of an operational amplifier (e.g., a negative terminal input) such as an operational amplifier 212 wherein the operational amplifier is operable to amplify a difference between negative and positive input terminals of the operational amplifier. Thus, the low pass filter is operable to smooth or average an input signal to enable the operational amplifier to produce a relatively stable and non-fluctuating amplified output.

The low pass filter typically comprises a resistor in series with the operational amplifier coupled to a capacitor that, in turn, is coupled to ground (substantially in parallel to the operational amplifier input node to which the capacitor is connected). Here, however, the low pass filter is replaced solely by a resistive element or resistor 214. When properly configured as described herein, the low pass filter may be formed by a combination of resistor 214 and parasitic capacitance of the operational amplifier 212 thereby achieving substantial IC real-estate savings.

Great savings in IC real estate may be achieved by eliminating the capacitor of a low pass filter. This savings if further amplified if large scale logic device includes a plurality of clock adjust circuits such as is shown here in FIG. 8. Unless the clock adjust circuit is properly designed, however, the lack of a capacitor to smooth or average the input can result in a rapidly fluctuating output.

Here, an operational amplifier 212 is designed to have a bandwidth that is significantly lower than the data rate of the recovered clock rate. Thus, the operational amplifier 212 is unable to track and respond to rapidly changing fluctuations of the recovered clock 200. Moreover, the parasitic gate capacitance of the operational amplifier 212, in conjunction with a large resistive value of resistor 214, serves to produce adequate low pass filtering in conjunction with the relatively low bandwidth of the operational amplifier in relation to the recovered clock rate. For exemplary purposes, the recovered clock rate is in the range of five to ten gigahertz, while the operational amplifier 212 has a bandwidth of approximately 100 kilohertz or 1 megahertz.

As may be seen, therefore, the slowly responding operational amplifier 212, along with the low pass filter created by resistor 214 and parasitic capacitance of the negative terminal input of operational amplifier 212 (as configured in the described embodiment), is operable to amplify a difference between a positive terminal input (which here is connected to a common mode voltage reference 217) and a negative terminal input which is comprised of the average value of the adjusted clock. The slowly responding operational amplifier facilitates using a low pass filter comprising a resistor with parasitic capacitance to form a low pass filter at an input of the operational amplifier.

The output of operational amplifier 212 is then produced to a feedback driver 218 which may be an inverting or a non-inverting driver.

Feedback driver 218 may be replaced merely by an inverter or a buffer. The output of feedback driver 218 is then produced to feedback adjust combining element 204 as a duty cycle feedback signal 216. Generally, duty cycle feedback signal 216 is operable to add or subtract current to adjust a DC level (and thus a cross-over point and duty cycle) of a recovered clock.

Figure 9:
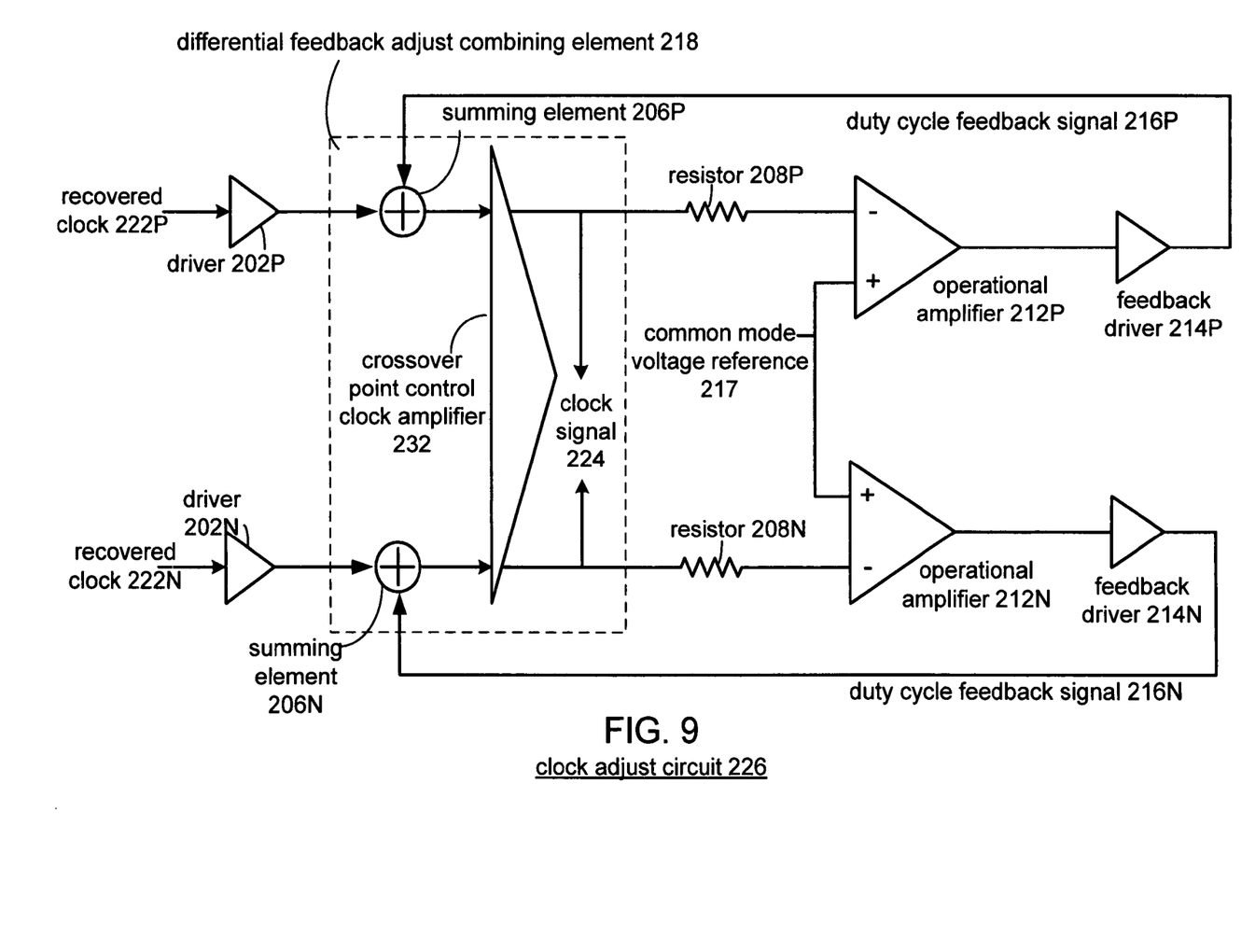
FIG. 9 is a functional block diagram of a differential clock adjust circuit according to one embodiment of the invention.

FIG. 9 is a functional block diagram of a differential clock adjust circuit according to one embodiment of the invention. As may be seen, a clock adjust circuit 226 includes positive and negative adjust branches configured similarly to the circuit of FIG. 8. One of average skill in the art may readily apply the discussion relating to FIG. 8 to the circuit shown in FIG. 9 in which an output clock signal 224 is generated based upon the received differential recovered clock signals 222P and 222N, and duty cycle feedback signals 216P and 216N. It is understood that output clock signal 224 also is differential.

The recovered clock 222P is first sent through driver 202P to summing element 206P which also receives the duty cycle feedback signal 216P. The summation of the recovered clock signal and the duty cycle feedback signal 216P is input by the crossover point control clock amplifier 232 (see FIG. 10). The output of the crossover point control clock amplifier 232 is the positive part of the differential adjusted clock signal 224. The positive part of the differential adjusted clock signal is then input to resistor 208P and output to the negative input terminal of operation amplifier 212P. The positive input terminal of operation amplifier 212P receives the common mode voltage reference 217. The output of operation amplifier 212P is input to feedback driver 214P. The output of feedback driver 214P is the duty cycle feedback signal 216P, which is feedback to summing element 206P. Similarly, the recovered clock 222N (the negative or inverted version of recovered clock 222P) is first sent through driver 202N to summing element 206N which also receives the duty cycle feedback signal 216N. In an alternative embodiment driver 202N inverts recovered clock 222P. The summation of the inverted recovered clock signal and the duty cycle feedback signal 216N is input by the crossover point control clock amplifier 232. The output of the crossover point control clock amplifier 232 is the negative part of the differential adjusted clock signal 224. The negative part of the differential, adjusted clock signal is then input to resistor 208N and output to the negative input terminal of operation amplifier 212N. The positive input terminal of operation amplifier 212N receives the common mode voltage reference 217. The output of operation amplifier 212N is input to feedback driver 214N. The output of feedback driver 214N is the duty cycle feedback signal 216N, which is feedback to summing element 206N.

In an alternate embodiment of the invention, the inputs of the operational amplifiers are cross coupled. In yet another alternate embodiment, the outputs of feedback drivers 214P and 214N may be cross connected to satisfy design specifications as may readily be determined by one of average skill in the art. Drivers 202P and 202N, resistors 208P and 208N, and operational amplifiers 212P and 212N, and their operation are substantially similar to their commonly number counterparts described in relation to FIG. 8. Similarly, duty cycle feedback signals 216P and 216N are similar to duty cycle feedback signal 216.

Figure 10:
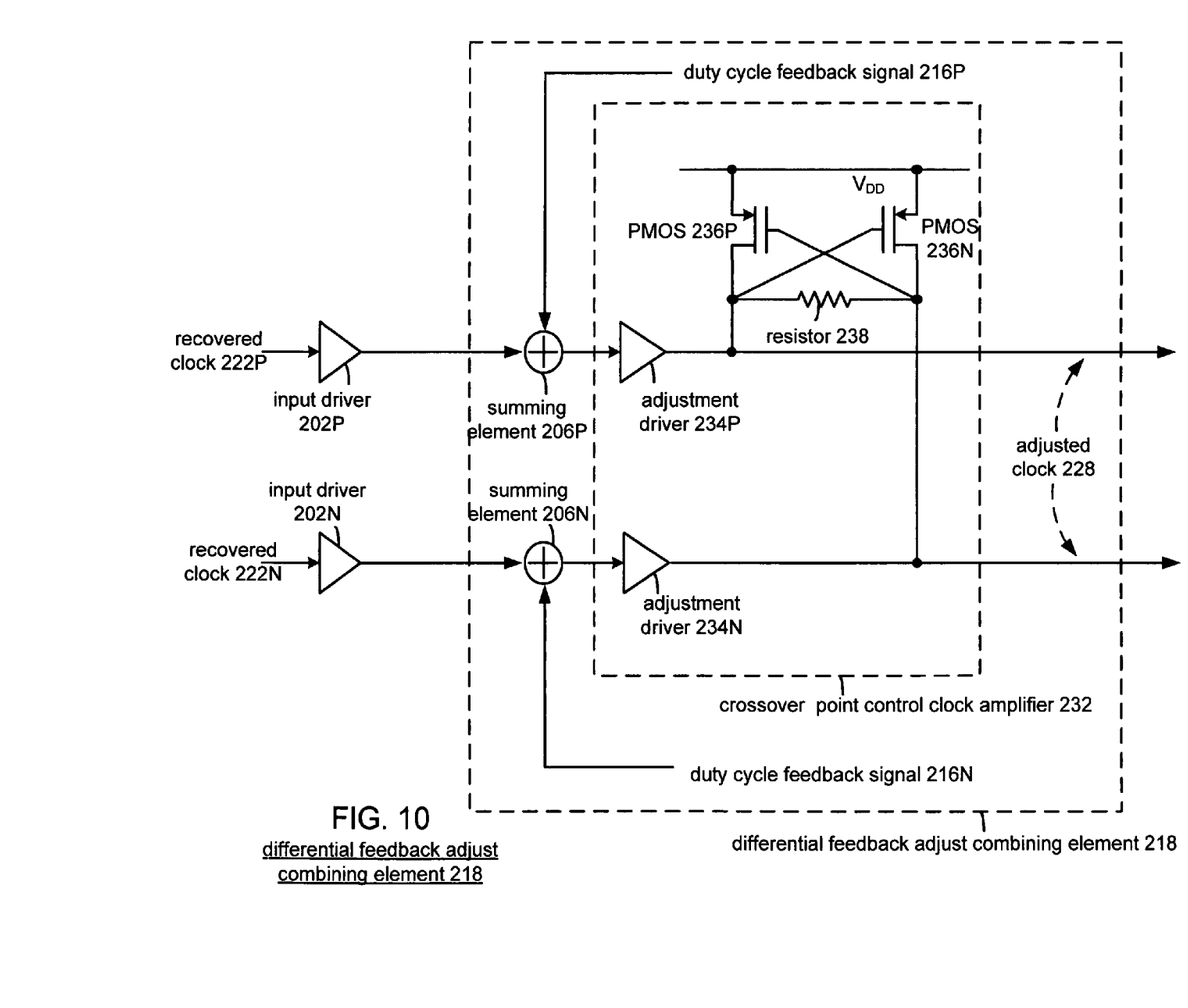
FIG. 10 is a schematic diagram of a feedback adjustment combining circuit according to one embodiment of the invention.

FIG. 10 is a schematic of the feedback adjust combining circuit according to one embodiment of the invention. The feedback adjust combining circuit is comprised of summing elements 206P and 206N to combine the input clocks with the feedback signals from the loop in the differential feedback adjust combining circuit 218. The area 232 within the dotted box in FIG. 10 is a crossover point control clock amplifier that includes a pair of adjustment drivers 234P and 234N. The adjustment drivers (could be implemented as inverters) and two cross coupled PMOS 236P and 236N, along with resistor 238 connected between the two PMOS 236N and 236P are jointly operable to reshape and adjust crossover points of input clock signals.

Generally, a feedback adjustment combining element includes a first feedback adjustment combining element, which combining element is coupled to receive a duty cycle feedback signal and is operable to reshape an input clock based on the feedback signal, to adjust a cross over point, and to provide an output clock with duty cycle distortion (DCD) correction. The feedback adjustment combining element further includes a first input driver operably coupled to produce an input clock signal into the first combining element as well as a first operational amplifier having a first input, a second input, and an output, wherein the second input is operably coupled to a common mode voltage reference, and further wherein a bandwidth of the first operational amplifier is substantially lower than a frequency of the input clock signal.

In the described embodiment, a first resistor is operably disposed between the first combining element and the first input of the first operational amplifier to filter an alternating current component of output clock signal and provide a direct current level to the first input of the first operational amplifier. Finally, a first feedback driver is operably coupled to produce the duty cycle feedback signal based on the output signal of the first operational amplifier produced at the output of the first operational amplifier.

Figure 11:
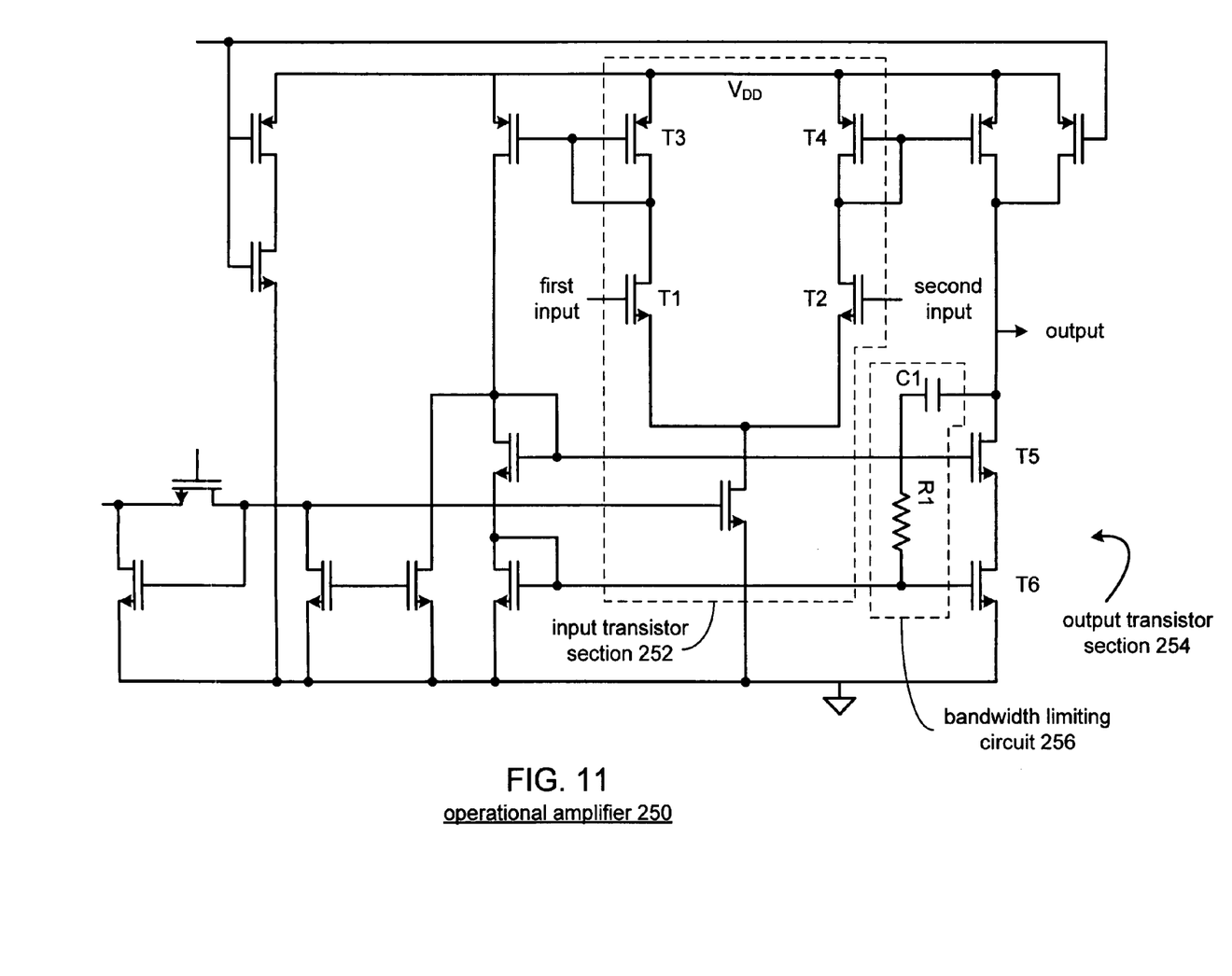
FIG. 11 is an operational amplifier formed according to one embodiment of the invention.

FIG. 11 is an operational amplifier formed according to one embodiment of the invention. Referring now to FIG. 11, an operational amplifier 250 is designed as a two-stage amplifier with a modified Miller capacitor structure in relation to an output stage of the operational amplifier 250. Generally, operational amplifier 250 includes an input transistor section 252 wherein the first input of the operational amplifier is the gate of a transistor T1, the second input of the operational amplifier is the gate of a transistor T2, a first intermediate output at the drain of transistor T3, and a second intermediate output at the drain of transistor T4, wherein the first and second intermediate outputs provide an amplified representation of the output clock signal with respect to the common mode voltage reference. The operational amplifier 250 also includes an output transistor section 254 including the output of the operational amplifier, wherein the output transistor section 254 is operably coupled to produce the output signal of the operational amplifier based on signals at the first and second intermediate outputs and a bandwidth limiting circuit. The bandwidth limiting circuit is operably coupled to the output transistor section and is operable to establish the bandwidth of the operational amplifier to be substantially lower than the frequency of the clock signal to be adjusted.

Input transistor section 252 includes a cascoded input transistor pair shown as transistors T1 and T2. Input transistors T1 and T2 are cascoded with transistors T3 and T4 configured as shown. Output transistor section 254 is connected to the input transistor section 252 as shown. Among other reasons, having a dual input stage amplifier with input and output transistor sections provides a stable design for a plurality of operating conditions. Further, having an output transistor section 254 supports inclusion of a bandwidth limiting circuit 256.

Bandwidth limiting circuit 256 includes cascoded output transistors T5 and T6 coupled as shown with a Miller capacitor and resistor coupled in series between a gate of transistor N-channel T6 and a drain of N-channel transistor T5. In one embodiment, the resistor is comprised of a transistor biased in a linear region and the capacitor is comprised of a capacitor configured transistor biased to provide a stable capacitance value.

The combination of R1 and C1 of the modified Miller capacitor is operable to increase a high frequency corner defined by values of R1 and C1 of operational amplifier 250 by a significant factor of, for example, 100. Conversely, the combination of R1 and C1 of the modified Miller capacitor is operable to decrease a low frequency corner defined by values of R1 and C1 of operational amplifier 250 by the same significant factor (in this example, by 100). While many design-specific considerations may help define reasonable values of R1 and C1, the present embodiment allows for values to be selected to coincide with a low frequency zero to facilitate canceling the low frequency zero.

FIG. 11 illustrates one embodiment of a two-stage amplifier as implemented in one embodiment of the invention and includes additional circuitry not particularly relevant to the present invention. One relevant portion for the discussion of FIG. 11, however, is the use of the modified Miller capacitor across the output stage to improve operation of the operational amplifier for use in a circuit that compensates for duty cycle imbalance as well as the use of a multi-stage amplifier.

Figure 12:
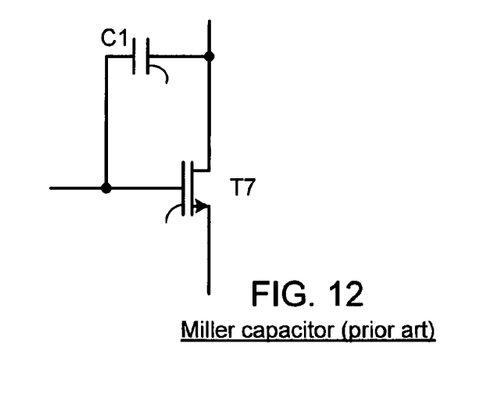
FIG. 12 is a schematic diagram of a prior art Miller capacitor and is included for illustrative purposes.

FIG. 12 is a schematic diagram of a prior art Miller capacitor and is included for illustrative purposes. Generally, as may be seen, Miller capacitors include a capacitor being coupled across the gate and drain of an N-MOS transistor.

Figure 13:
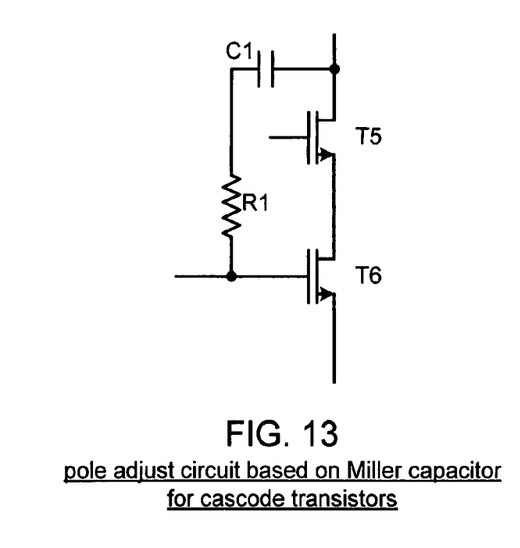
FIG. 13 is a schematic diagram of a modified Miller capacitor according to one embodiment of the invention.

FIG. 13 is a schematic diagram of a modified Miller capacitor according to one embodiment of the invention. Specifically, R1 is coupled in series with C1. The combination of C1 and R1 are coupled across transistors T5 and T6 from the drain of T5 to the gate of T6. As such, the high and low frequency poles of the operational amplifier are adjusted by a constant amount as described above.

Figure 14:
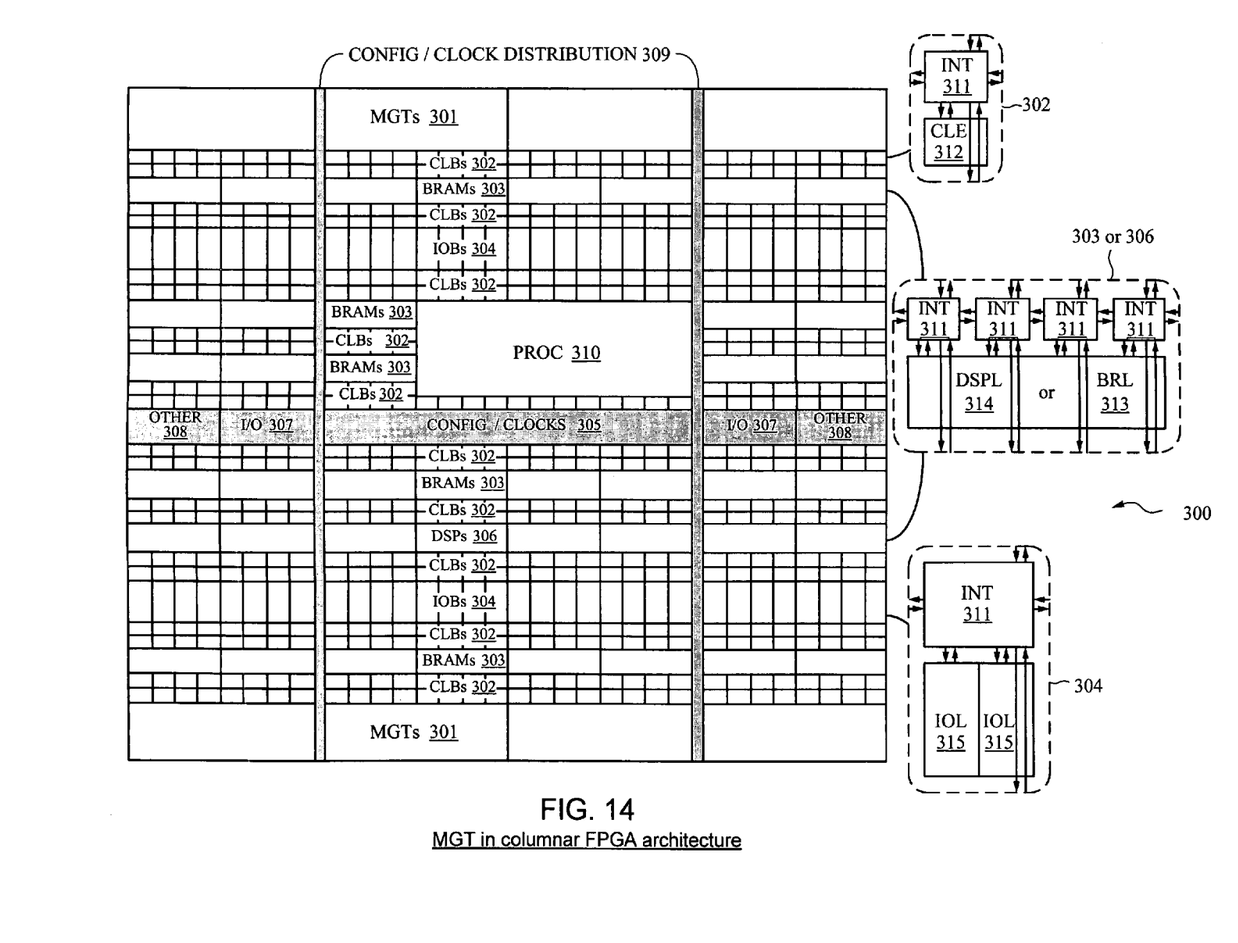
FIG. 14 illustrates an FPGA architecture that includes a large number of different programmable tiles.

FIG. 14 illustrates an FPGA architecture 300 that includes a large number of different programmable tiles including multi-gigabit transceivers (MGTs 301), configurable logic blocks (CLBs 302), random access memory blocks (BRAMs 303), input/output blocks (IOBs 304), configuration and clocking logic (CONFIG/CLOCKS 305), digital signal processing blocks (DSPs 306), specialized input/output blocks (I/O 307) (e.g., configuration ports and clock ports), and other programmable logic 308, such as digital clock managers, analog-to-digital converters, system monitoring logic, and so forth. Some FPGAs also include dedicated processor blocks (PROC 310).

In some FPGAs, each programmable tile includes a programmable interconnect element (INT 311) having standardized connections to and from a corresponding interconnect element in each adjacent tile. Therefore, the programmable interconnect elements taken together implement the programmable interconnect structure for the illustrated FPGA. The programmable interconnect element (INT 311) also includes the connections to and from the programmable logic element within the same tile, as shown by the examples included at the top of FIG. 14.

For example, a CLB 302 can include a configurable logic element (CLE 312) that can be programmed to implement user logic plus a single programmable interconnect element (INT 311). A BRAM 303 can include a BRAM logic element (BRL 313) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 306 can include a DSP logic element (DSPL 314) in addition to an appropriate number of programmable interconnect elements. An IOB 304 can include, for example, two instances of an input/output logic element (IOL 315) in addition to one instance of the programmable interconnect element (INT 311). As will be clear to those of skill in the art, the actual I/O pads connected, for example, to the I/O logic element 315, are manufactured using a metal layer above the various illustrated logic blocks, and typically are not confined to the area of the input/output logic element 315.

In the pictured embodiment of FIG. 14, a columnar area near the center of the die (shown shaded in FIG. 14) is used for configuration, clock, and other control logic. Horizontal areas 309 extending from this column are used to distribute the clocks and configuration signals across the breadth of the FPGA.

Some FPGAs utilizing the architecture illustrated in FIG. 14 include additional logic blocks that disrupt the regular columnar structure making up a large part of the FPGA. The additional logic blocks can be programmable blocks and/or dedicated logic. For example, the processor block PROC 310 shown in FIG. 14 spans several columns of CLBs and BRAMs.

Note that FIG. 14 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 14 are purely exemplary. For example, in an actual FPGA more than one adjacent column of CLBs is typically included wherever the CLBs appear to facilitate the efficient implementation of user logic. Thus, the FPGA of FIG. 14 illustrates but one architecture within which the various embodiments of the invention may be presented.

The above description of the embodiments of the present invention may be implemented utilizing different circuit technologies including various different FPGA technologies and topologies. For example, FPGA devices may employ an I/O ring architecture or a columnar architecture. Advanced FPGAs can include several different types of programmable logic blocks in the array.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents, and alternatives falling within the spirit and scope of the present invention as defined by the claims.

What is claimed is:

1. A clock circuit having a controlled duty cycle, comprising:
    a feedback adjustment combining element comprising a first summing element operably disposed to provide a sum of a recovered clock and a duty cycle feedback signal, and further comprising a crossover point control clock amplifier which is operable to generate an adjusted clock based upon the sum of the recovered clock and the duty cycle feedback signal produced by the first summing element;
    a first operational amplifier having a first input, a second input, and a first output providing the duty cycle feedback signal, wherein the second input is operably coupled to a common mode voltage reference, and further wherein a bandwidth of the first operational amplifier is substantially lower than a frequency of the recovered clock; and
    a first resistor operably disposed between the feedback adjustment combining element and the first input of the first operational amplifier; wherein the crossover point control clock amplifier, comprises two cross coupled p-channel MOSFET (PMOS) transistors and a second resister coupled between the two PMOS transistors that are jointly operable to adjust cross points of differential clocks' rising and falling edges to be at a substantially similar voltage level.

2. The clock circuit of claim 1 further including a second summing element in the feedback adjustment combining element operable to combine the duty cycle feedback signal with the recovered clock, and further operable to provide a duty cycle corrected output to the crossover point control clock amplifier.

3. The clock circuit of claim 1, wherein the first resistor comprises a resistance value operable to substantially filter an alternating current (AC) component of the input clock signal and to provide the clock signal's direct current (DC) level to the first operational amplifier.

4. The clock circuit of claim 1, wherein the first operational amplifier comprises:
   an input transistor section including the first input of the first operational amplifier, the second input of the first operational amplifier, a first intermediate output, and a second intermediate output, wherein the first and second intermediate outputs provide an amplified representation of the difference between the DC level of adjusted clock signal and the common mode voltage reference;
   an output transistor section including the output of the first operational amplifier, wherein the output transistor section is operably coupled to produce the output signal of the first operational amplifier based on signals at the first and second intermediate outputs; and
   a bandwidth limiting circuit operably coupled to the output transistor section to establish the bandwidth of the first operational amplifier to be substantially lower than the frequency of the recovered clock.

5. The clock circuit of claim 4, wherein the bandwidth limiting circuit comprises:
   a compensation resistor; and
   a capacitor coupled in series with the compensation resistor, wherein a series combination of the compensation resistor and capacitor is operably coupled to the output transistor section.

6. The clock circuit of claim 5 wherein:
   the compensation resistor includes a transistor biased in a linear region; and
   the capacitor includes a transistor biased to achieve a desired gate source voltage and a stable capacitance value.

7. The clock circuit of claim 1 further including:
   the feedback adjustment combining element further comprising a second summing element operably disposed to provide a second sum of an inverted recovered clock and a second duty cycle feedback signal, the second summing element coupled to the crossover point control clock amplifier;
   a second operational amplifier having a third input, a fourth input, and a second output providing the second duty cycle feedback signal, wherein the fourth input is operably coupled to the common mode voltage reference, and wherein a bandwidth of the second operational amplifier is substantially lower than a data rate of the inverted recovered clock; and
   a second resistor coupled to the crossover point control clock amplifier and operably coupled to provide the DC level of the adjusted clock to the third input of the second operational amplifier.

8. A high speed half rate serial data transmitter, wherein the transmitter comprises:
   a parallel-to-serial conversion module operably coupled to convert parallel data into an even serial data stream and an odd serial data stream in accordance with a clock signal;
   a serializing module operably coupled to combine the even serial data stream and the odd serial data stream into a transmit serial data stream in accordance with the clock signal; and
   a clock circuit operably coupled to produce the clock signal, wherein the clock circuit includes:
      a feedback adjustment combining element, wherein the combining element is coupled to receive a duty cycle feedback signal and is operable to reshape an input clock based on the duty cycle feedback signal, to adjust a cross over point, and to provide an output clock;
      a first input driver operably coupled to produce an input clock signal into the feedback adjustment combining element;
      a first operational amplifier having a first input, a second input, and an output signal, wherein the second input is operably coupled to a common mode voltage reference, and further wherein a bandwidth of the first operational amplifier is substantially lower than a frequency of the input clock;
      a first resistor operably disposed between the feedback adjustment combining element and the first input of the first operational amplifier to filter an alternating current component of the output clock and provide a direct current level to the first input of the first operational amplifier; and
      a first feedback driver operably coupled to produce the duty cycle feedback signal based on the output signal of the first operational amplifier; wherein the feedback adjustment combining element has a summing element and a crossover point control clock amplifier, wherein the crossover point control amplifier comprises two cross coupled p-channel MOSFET (PMOS) transistors and a third resister coupled between the two PMOS transistors that are jointly operable to adjust cross points of differential clocks' rising and falling edges to be at a substantially similar voltage level.

9. The transmitter of claim 8, wherein the first operational amplifier comprises:
   an input transistor section including the first input of the first operational amplifier, the second input of the first operational amplifier, a first intermediate output, and a second intermediate output, wherein the first and second intermediate outputs provide an amplified representation of the clock signal with respect to the common mode voltage reference;
   an output transistor section including the output of the first operational amplifier, wherein the output transistor section is operably coupled to produce the output clock signal of the first operational amplifier based on signals at the first and second intermediate outputs; and
   a bandwidth limiting circuit operably coupled to the output transistor section to establish the bandwidth of the first operational amplifier to be substantially lower than the frequency of the input clock signal.

10. The transmitter of claim 9, wherein the bandwidth limiting circuit comprises:
   a compensation resistor; and
   a capacitor coupled in series with the compensation resistor, wherein a series combination of the compensation resistor and capacitor is operably coupled to the output of the operational amplifier and to an input of the output transistor section.

11. The transmitter of claim 10 wherein:
   the compensation resistor includes a transistor biased in a linear region; and
   the capacitor includes a transistor biased to achieve a desired gate source voltage and a stable capacitance value.

12. The transmitter of claim 8, wherein the clock circuit further comprises:

a second input driver operably coupled to provide an inverted input clock signal, wherein the inverted input clock signal and the input clock signal provide a differential clock signal;

a second operational amplifier having a third input, a fourth input, and a second output, wherein the fourth input is operably coupled to the common mode voltage reference, wherein bandwidth of the second operational amplifier is substantially lower than frequency of the inverted input clock signal;

a second resistor operably coupled to provide a direct current level of the inverted output clock signal to the third input of the second operational amplifier; and a second feedback driver operably coupled to produce a second duty cycle feedback signal from a second output signal of the operational amplifier.

13. A clock circuit operably coupled to produce an adjusted recovered clock signal from the recovered clock signal, wherein the clock circuit comprises:

a first input driver operably coupled to produce an input clock signal into a first summing element, the first summing element summing a first duty cycle feedback signal and the input clock signal;

a second input driver operably coupled to provide an inverted input clock signal into a second summing element, the second summing element summing a second duty cycle feedback signal and the inverted input clock signal, wherein the inverted input clock signal and the input clock signal provide a differential clock signal;

a cross point control clock amplifier coupled to the first and second summing elements, the cross point control clock amplifier producing the adjusted recovered clock signal;

a first operational amplifier having a first input, a second input, and a first output, wherein the second input is operably coupled to a common mode voltage reference and the first output provides the first duty cycle feedback signal;

a first resistor operably disposed between the cross point control clock amplifier and the first input of the first operational amplifier;

a second operational amplifier having a third input, a fourth input, and a second output, wherein the fourth input is operably coupled to the common mode voltage reference and the second output provides the second duty cycle feedback signal; and a second resistor operably disposed between the cross point control clock amplifier and the third input of the second operational amplifier; wherein the crossover point control clock amplifier, wherein the crossover point control amplifier comprises two cross coupled p-channel MOSFET (PMOS) transistors and a third resister coupled between the two PMOS transistors that are jointly operable to adjust cross points of differential clocks' rising and falling edges to be at a substantially similar voltage level.

14. The clock circuit of claim 13, wherein the first operational amplifier comprises:

an input transistor section including the first input of the first operational amplifier, the second input of the first operational amplifier, a first intermediate output, and a second intermediate output, wherein the first and second intermediate outputs provide an amplified representation of the difference of the DC level of the output clock signal and the common mode voltage reference;

an output transistor section including the output of the first operational amplifier, wherein the output transistor section is operably coupled to produce the output signal of the first operational amplifier based on signals at the first and second intermediate outputs; and a bandwidth limiting circuit operably coupled to the output transistor section to establish the bandwidth of the first operational amplifier to be substantially lower than the frequency of the input clock signal.

15. The clock circuit of claim 14, wherein the bandwidth limiting circuit comprises:

a compensation resistor; and a capacitor coupled in series with the compensation resistor, wherein a series combination of the compensation resistor and capacitor is operably coupled to the output of the first operational amplifier and to an input of the output transistor section.

16. The clock circuit of claim 13 further comprising a first feedback driver coupled between the first operational amplifier and first summing element and a second feedback driver coupled between the second operational amplifier and second summing element.

* * * * *